United States Patent
Spitz et al.

(10) Patent No.: US 6,518,101 B1
(45) Date of Patent: Feb. 11, 2003

(54) MULTI-LAYER DIODES AND METHOD OF PRODUCING SAME

(75) Inventors: Richard Spitz, Reutlingen (DE); Alfred Goerlach, Karlsruhe (DE); Barbara Will, Herrenberg (DE); Helga Uebbing, Reutlingen (DE); Ning Qu, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/914,405

(22) PCT Filed: Feb. 24, 2000

(86) PCT No.: PCT/DE00/00508

§ 371 (c)(1),
(2), (4) Date: Dec. 13, 2001

(87) PCT Pub. No.: WO00/52761

PCT Pub. Date: Sep. 8, 2000

(30) Foreign Application Priority Data

Feb. 26, 1999 (DE) .......................... 199 08 399

(51) Int. Cl.[7] .............................. H01L 21/332
(52) U.S. Cl. .................. 438/133; 438/113; 438/460

(58) Field of Search .................. 438/109, 113, 438/133, 458, 460, 462

(56) References Cited

U.S. PATENT DOCUMENTS 3,706,129 A * 12/1972 McCann ...................... 29/583
5,468,976 A 11/1995 Eseev et al.
6,291,316 B1 * 9/2001 Knowles et al. ............ 438/424

FOREIGN PATENT DOCUMENTS

DE 28 15 606 * 10/1979

OTHER PUBLICATIONS

B. Jayant Baliga, *Power Semiconductor Devices,* ISBN No. 0–534–94098–6, PWS Publishing Company, 1995, p. 266.**

* cited by examiner

Primary Examiner—Tuan H. Nguyen
(74) Attorney, Agent, or Firm—Kenyon & Kenyon

(57) ABSTRACT

It is proposed to implement the emitter short-circuit structure of a multilayer diode by providing grooves which cut through topmost layer 2 of the multilayer diode. A metal layer 20 applied thereon electrically shorts the topmost layer to subjacent layer 3.

9 Claims, 3 Drawing Sheets

MULTI-LAYER DIODES AND METHOD OF PRODUCING SAME

FIELD OF THE INVENTION

The present invention relates to a method for producing multilayer diodes and thyristors, respectively.

BACKGROUND INFORMATION

From the book "Power Semiconductor Devices" by B. Jayant Baliga, 1995, ISBN Number 0-534-94098-6, PWS Publishing Company, page 266, thyristors having an emitter short-circuit structure are described in which the topmost highly n-doped layer of the multilayer arrangement is restricted by photolithography to defined regions on the surface.

SUMMARY OF THE INVENTION

In contrast, the method of the present invention has the advantage of providing an emitter short-circuit structure which can be produced in a simple manner and in parallel with notches for separating the diodes or thyristors from the wafer used. In addition, because of their lateral extension over the entire silicon wafer, the diffused layers exhibit high homogeneity, a high yield thereby being attained when manufacturing individual diodes and thyristors, respectively.

DETAILED DESCRIPTION

Figure 1:
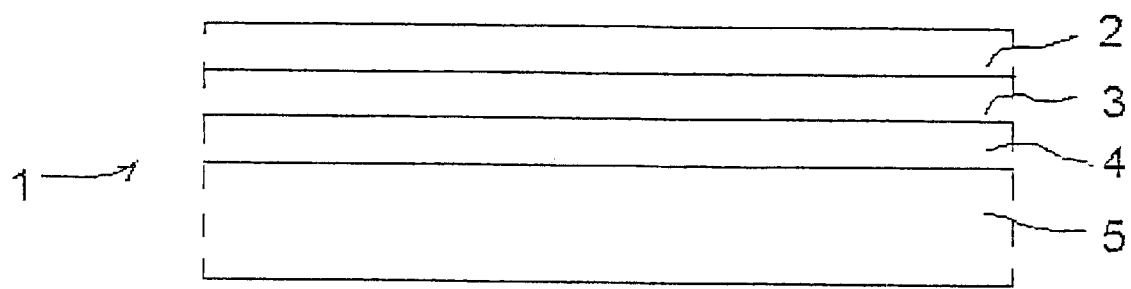
FIG. 1 shows a silicon wafer.

FIG. 1 shows the side view of one part of a silicon wafer 1 having a diameter of 125 millimeters and a thickness of 200 micrometers. It shows a layer arrangement 2, 3, 4, 5. Prior to introducing the layer arrangement, the (unprocessed) wafer had a phosphorus doping of approximately $2.5 \times 10^{17}$ atoms per cubic centimeter. The manufacture of the layer arrangement is described in the following.

To produce p-doped layers 5 and 3, a glass layer approximately 2 micrometers thick having approximately 3.2 percent by weight of boron is first of all deposited on both sides of the unprocessed wafer. The deposition is carried out using chemical vapor deposition ("CVD") of boron silane under atmospheric pressure (atmospheric pressure CVD, "APCVD"). This coating step is followed by a first diffusion step to drive the boron into the silicon wafer. The diffusion time is approximately 28 hours at a temperature of approximately 1265 degrees Celsius under oxidizing atmosphere. After this diffusion step, the glass layers on both wafer sides are removed by dipping into 50 percentage hydrofluoric acid.

In a further step to produce n-doped topmost layer 2, again using APCVD, a glass layer approximately 1.6 micrometers thick which contains 6.5 percent by weight of phosphorus is deposited on one side of the wafer that is now designated as the front. Phosphorus silane can be used as gas.

For the further formation of p-doped layer 5, a glass layer 3 micrometers thick having 5 percent by weight of boron is applied in a further step using APCVD on the back of the wafer opposite the front. The dopants applied on the front and back in this and in the previously described coating step are now driven in in a further diffusion step at 1265 degrees Celsius for 15 hours under oxidizing atmosphere. After this diffusion step, the glass layers on both wafer sides are again removed by dipping into 50 percentage hydrofluoric acid.

At this point, the silicon wafer is available in the layer sequence shown in FIG. 1, highly n-doped layer 2 having a thickness of 20 micrometers, p-doped layer 3 having a thickness of 45 micrometers, and highly p-doped layer 5 having a thickness of 50 micrometers. The n-doped layer 4 has the doping of the unprocessed wafer utilized.

Figure 2:
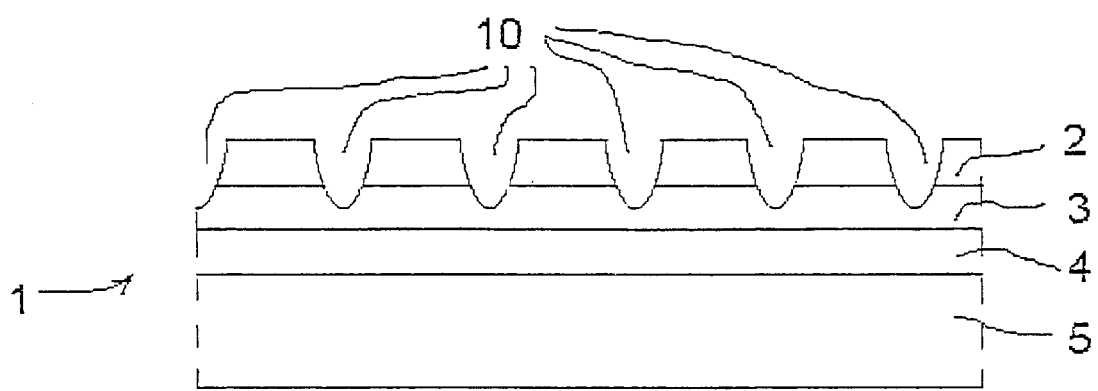
FIG. 2 shows a silicon wafer with notches.

In a further step, grooves are introduced into layer 2, for example, by sawing with a diamond saw, such that the bottom of the groove in each case lies in layer 3, so that layer 2 is completely cut through in the region of the grooves. FIG. 2 shows a cross-sectional side view of silicon wafer 1 with grooves 10 introduced therein. The distance between the parallel grooves is selectively in a range between 2 and 3 millimeters, particularly in a range from 2.2 to 2.6 millimeters; the groove depth is approximately 30 micrometers. In this context, a second group of grooves is arranged at an angle of approximately 90 degrees with respect to the grooves visible in FIG. 2, so that the front is partitioned into rectangular, in particular quadratic areas.

Figure 3:
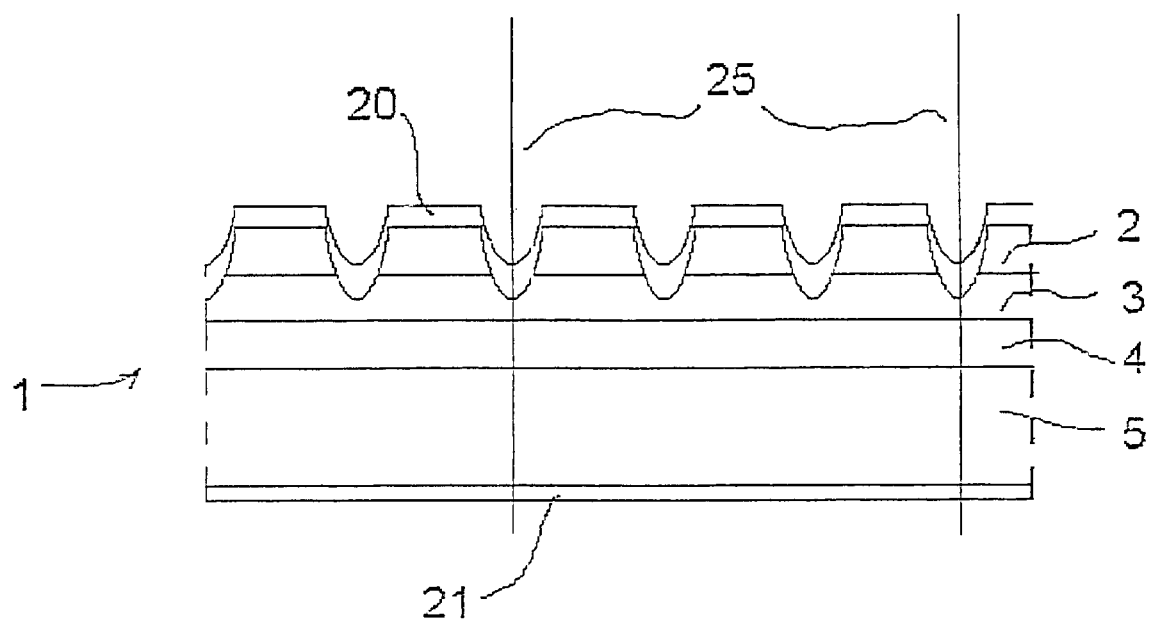
FIG. 3 shows a silicon wafer immediately prior to being diced into individual chips.

In another step, metal layers are deposited by sputtering simultaneously on both sides of the wafer, first of all a chromium layer 70 nanometers thick, followed by a nickel-vanadium layer 160 nanometers thick and a silver layer 100 nanometers thick. FIG. 3 shows the silicon wafer with applied metal layers, the metal layer on the back forming back-side contact 21, and the metal layer on the front forming emitter short-circuit contact 20. The emitter short-circuit contact shorts topmost highly n-doped layer 2 to subjacent p-doped layer 3.

In a further step, the wafer is diced by a sawing step, for example, along each second groove or, as shown in FIG. 3, along each third groove, in each case in the middle of the groove along dicing lines 25. If the wafer is diced along each second groove, chips are yielded having individual four-layer diodes (thyristor diodes) with chip dimensions of approximately 4.5 by 4.5 millimeters.

The chips are subsequently soldered into press-in diode housings, known per se, and sealed in with epoxy resin. Typical electrical characteristics for the four-layer diodes are:

Breakover voltage: 49 to 52 volts,

Breakover current: 0.8 to 1.2 amperes.

Three-layer diodes (transistor diodes) having an n+/n/p/n+ layer sequence can also be produced in an analogous manner to four-layer diodes. The single difference with respect to the manufacturing method described is that in the coating steps, a glass layer approximately 1.6 micrometers thick having 6.5 percent by weight of phosphorus (instead of boron) is deposited on the back of the wafer. After the second diffusion step, the thickness of the back, highly n-doped layer is approximately 50 micrometers, analogous to aforesaid layer 5. Typical electrical characteristics for the three-layer diodes are:

Breakover voltage: 49 to 52 volts,

Breakover current: 0.8 to 1.2 amperes,

Forward voltage: 1.5 to 2.0 volts given a current of 100 amperes in the forward conducting direction.

In alternative specific embodiments, the described method can also be carried out using different steps which likewise lead to the described layer arrangements (for example, the layer arrangement 2, 3, 4, 5). Among these are, for example, foil diffusion processes, vapor-phase coating processes and/or ion implantation methods. Furthermore, the electrical characteristics of the diodes can be varied by varying the chip dimensions, the depths of the grooves, the groove pattern of intersecting grooves, the layer thicknesses or the characteristic values of the unprocessed wafer. As is apparent from the literature reference indicated in the introductory part of the Specification, thyristors differ from four-layer diodes essentially due to an additional gate terminal. Thus, with small changes in the manufacturing method described, it is also possible to produce thyristors which have an emitter short circuit implemented by a groove.

What is claimed is:

1. A method for producing one of a multilayer diode and a thyristor including an emitter short-circuit structure, comprising the steps of:

producing a multilayer arrangement from a semiconductor wafer;

sawing grooves in a front of the multilayer arrangement so that a topmost layer of the multilayer arrangement is cut through;

applying a back contact on a back of the multilayer arrangement opposite the front of the multilayer arrangement, and applying an emitter short-circuit contact on the front so that the topmost layer and a subjacent layer are short-circuited; and dicing the multilayer arrangement along a part of the grooves to produce separated multilayer chips such that in addition to the grooves along which the dicing is carried out, each multilayer chip includes at least one further groove not subject to the dicing step, wherein the at least one further groove and corresponding emitter short-circuit contact define an emitter short-circuit structure.

2. The method according to claim 1, wherein:
the grooves are equidistant.

3. The method according to claim 1, further comprising the step of:

arranging two groups of the grooves that intersect at an angle of approximately 90 degrees, so that the front is partitioned into rectangular areas.

4. The method according to claim 3, wherein:
the rectangular areas correspond to quadratic areas.

5. The method according to claim 3, wherein:
the grooves of each group are arranged at a distance of approximately 2.5 mm.

6. The method according to claim 1, wherein:
the topmost layer has a thickness of approximately 20 micrometers,
the subjacent layer has a thickness of approximately 45 micrometers, and
the grooves have a depth of approximately 30 micrometers.

7. The method according to claim 1, wherein:
the multilayer arrangement is produced in a chemical vapor deposition operation.

8. The method according to claim 7, wherein:
the chemical vapor deposition operation includes an APCVD operation.

9. The method according to claim 1, wherein:
the multilayer arrangement is produced in at least one of a foil diffusion operation, a vapor-phase coating operation, and an ion implantation operation.

* * * * *

UNITED STATES PATENT AND TRADEMARK OFFICE
CERTIFICATE OF CORRECTION

PATENT NO. : 6,518,101 B1
DATED : February 11, 2003
INVENTOR(S) : Richard Spitz et al.

It is certified that error appears in the above-identified patent and that said Letters Patent is hereby corrected as shown below:

Title page,
Item [57], Abstract,
Line 1, delete "It is proposed to implement the" and insert -- An --.
Line 2, after "diode" insert -- is implemented --.
Line 3, delete "2".
Line 4, delete "20".
Line 5, delete "3".

Signed and Sealed this

Sixth Day of July, 2004

JON W. DUDAS
*Acting Director of the United States Patent and Trademark Office*